(12) United States Patent
Yasui et al.

(10) Patent No.: US 7,771,780 B2
(45) Date of Patent: Aug. 10, 2010

(54) METHOD OF PRODUCING COMPOSITE MATERIAL, METHOD OF PRODUCING PIEZOELECTRIC ACTUATOR, METHOD OF PRODUCING INK-JET HEAD, AND PIEZOELECTRIC ACTUATOR

(75) Inventors: Motohiro Yasui, Nagoya (JP); Jun Akedo, Tsukuba (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 0 days.

(21) Appl. No.: 11/467,012

(22) Filed: Aug. 24, 2006

(65) Prior Publication Data
US 2007/0046156 A1 Mar. 1, 2007

(30) Foreign Application Priority Data
Aug. 24, 2005 (JP) .............................. 2005-243000

(51) Int. Cl.
*B05D 5/12* (2006.01)
*H01G 7/00* (2006.01)

(52) U.S. Cl. .................... 427/100; 29/25.35; 29/25.41; 29/25.42

(58) Field of Classification Search ................. 427/100; 29/25.35, 25.41, 25.42
See application file for complete search history.

(56) References Cited

U.S. PATENT DOCUMENTS 4,109,031 A * 8/1978 Marscher .................... 427/191
6,336,717 B1 * 1/2002 Shimada et al. ............... 347/71
6,987,349 B2 * 1/2006 Murai ........................ 310/332
7,229,160 B2 * 6/2007 Kobayashi ................... 347/68
2004/0043230 A1 * 3/2004 Hatono et al. ............... 428/458
2006/0046319 A1 * 3/2006 Takeda .......................... 438/3
2006/0132000 A1 * 6/2006 Katsuki et al. ............. 310/363
2006/0208617 A1 * 9/2006 Murai ........................ 310/328

FOREIGN PATENT DOCUMENTS

JP 200094681 4/2000
JP 200154946 2/2001

\* cited by examiner

*Primary Examiner*—Brian K Talbot
(74) *Attorney, Agent, or Firm*—Baker Botts L.L.P.

(57) ABSTRACT

A method of producing a piezoelectric actuator includes the steps of: forming a first electrode layer on a substrate by jetting an aerosol containing particles of a conductive material and ceramic particles onto the substrate to make the particles adhere to the substrate; forming a piezoelectric layer on the first electrode layer by jetting an aerosol containing particles of a piezoelectric material onto the first electrode layer to make the particles adhere to the electrode; performing an annealing treatment for the piezoelectric layer; and forming, on the piezoelectric layer, a second electrode layer paring with the first electrode layer. Accordingly, the adherence between the substrate and the first electrode layer and between the first electrode layer and the piezoelectric layer are improved, thereby hardly causing exfoliation of the layers due to differences in coefficients of thermal expansion between the layers.

11 Claims, 7 Drawing Sheets

METHOD OF PRODUCING COMPOSITE MATERIAL, METHOD OF PRODUCING PIEZOELECTRIC ACTUATOR, METHOD OF PRODUCING INK-JET HEAD, AND PIEZOELECTRIC ACTUATOR

CROSS REFERENCE TO RELATED APPLICATION

The present application claims priority from Japanese Patent Application No. 2005-243000, filed on Aug. 24, 2005, the disclosure of which is incorporated herein by reference in its entirety.

BACKGROUND OF THE INVENTION

1. Field of the Invention

The present invention relates to a method of producing a composite material, a method of producing a piezoelectric actuator, a method of producing an ink-jet head, and a piezoelectric actuator.

2. Description of the Related Art

Japanese Patent Application Laid-open No. 2001-54946 discloses an example of a piezoelectric actuator used, for example, in an ink-jet head or the like. The ink-jet head includes a channel forming body, which has pressure chambers and nozzles. Each of the pressure chambers communicates with an opening of one of the nozzles. The piezoelectric actuator includes a substrate (a vibration plate), which is arranged on the channel forming body so as to close the opening of each of the pressure chambers. Lower electrodes, piezoelectric layers, and upper electrodes are stacked or laminated on the substrate. When an electric field is applied between each of the lower electrodes and the associated upper electrodes, the piezoelectric layer deforms, thereby warping the substrate. This exerts pressure to the ink in the associated pressure chamber so as to discharge the ink through the associated nozzle.

As a method of producing such a piezoelectric actuator, there is a method called the aerosol deposition (AD) method disclosed in Japanese Patent Application Laid-open No. 2001-54946. In this method, a substance (aerosol) in which fine particles, of a piezoelectric material such as Lead Zirconate Titanate (PZT) or the like, is dispersed in a gas, is jetted toward a surface of a substrate such that the fine particles are collided and deposited onto the substrate, thereby forming a piezoelectric film.

The piezoelectric film formed by the AD method needs to be subjected to an annealing treatment so as to impart, to the piezoelectric film, piezoelectric characteristics necessary for warping the substrate sufficiently.

However, when an annealing treatment was performed at a high temperature, for example exceeding 600° C., an element contained in the substrate diffuses into the piezoelectric film and degrade the piezoelectric characteristic of the film in some cases. In particular, in recent years, it has been demanded that stainless steel which is cheap and highly workable be used as a substrate. However, with the stainless steel, this problem of diffusion becomes prominent since stainless steel contains metallic elements such as Fe, Cr and the like which are easily diffuse into a piezoelectric film. Therefore, in order to improve the piezoelectric characteristic of a piezoelectric film, a layer of insulative oxide such as alumina or the like is provided as a diffusion-preventive layer between the piezoelectric film and the substrate. In such a case, a lower electrode is provided between the diffusion-preventive layer and the piezoelectric layer so that electric field can be applied to the piezoelectric layer.

However, in a case of stacking a large number of layers and when the piezoelectric layer is annealed at a high temperature, stress is developed at interfaces of stacked layers due to the differences in coefficients of thermal expansion between the materials with which the layers are respectively formed. Due to the stress, exfoliation of the laminated layers is easily caused.

In producing an ink-jet head, it is preferable that an ink channel forming body is formed of metallic material such that minute or fine ink channels can be formed in the ink channel forming body easily. Also, with respect to a substrate for a piezoelectric actuator to be joined to the channel forming body by thermo-compression bonding, it is preferable that the substrate is formed of a metal having a coefficient of thermal expansion similar to that of the metal material forming the channel forming body, namely the substrate is formed of a same metallic material to that forming the channel forming body, in order to avoid a problem or inconvenience such as warpage of the substrate which can occur when the substrate is joined to the channel forming body by thermo-compression bonding. However, when the substrate is metallic, a metallic element contained in the substrate is likely to diffuse into the piezoelectric layer. Accordingly, although it is necessary to provide a diffusion-preventive layer between the substrate and the piezoelectric layer, it is not always easy to ensure the adherence by a conventional method between a large numbers of stacked layers as described above.

SUMMARY OF THE INVENTION

A first object of the present invention is to provide a method of producing a composite material with which the adherence between adjacent layers of the film can be improved. A second object of the present invention is to provide a method of producing a piezoelectric actuator with which the adherence between adjacent layers of the actuator can be improved. A third object of the present invention is to provide a method of producing an ink-jet head with which the adherence between adjacent layers of the head can be improved. A fourth object of the present invention is to provide a piezoelectric actuator which is capable of improving the adherence between adjacent layers of the actuator.

According to a first aspect of the present invention, there is provided a method of producing a composite material, the method including:

mixing conductive particles and ceramic particles to prepare a mixture; and jetting an aerosol containing the mixture onto a substrate to form the composite film.

This method makes it easy to produce a composite material which conductive particles (particles of a conductive material) and ceramic particles.

According to a second aspect of the present invention, there is provided a method of producing a piezoelectric actuator, the method including:

a first electrode layer forming step for forming a first electrode layer on a substrate by jetting an aerosol containing conductive particles and ceramic particles onto the substrate so as to adhere the conductive particles and the ceramic particles to the substrate;

a piezoelectric layer forming step for forming a piezoelectric layer on the first electrode layer by jetting an aerosol containing piezoelectric particles (particles of a piezoelectric material) onto the first electrode layer so as to adhere the piezoelectric particles to the first electrode layer;

an annealing treatment step for performing an annealing treatment for the piezoelectric layer; and a second electrode layer forming step for forming, on the piezoelectric layer, a second electrode layer paring with the first electrode layer.

The ceramic particles are not limited in particular. It is sufficient that the hardness of the ceramic particles is such that the particles can embed or lodge in the substrate upon colliding on the substrate and that the ceramic particles are chemically stable. Specifically, the ceramic particles may be particles of one of oxide ceramics such as alumina, silica, zirconia, mullite, or a mixture of not less than two of the above.

The conductive particles are not limited in particular provided that the particles are generally used as a material for electrode. The conductive particles may be, for example, particles of one of Ag, Pt, Au, Co, Ti, Ni, Pd and the like, or a mixture of not less than two of the above. In particular, Pt, Au and the like are preferable since Pt, Au and the like hardly diffuse into another layer, in view of securing the conductivity for the electrodes as well as preventing the degradation of piezoelectric characteristics of the piezoelectric layer due to the diffusion.

The substrate material and the piezoelectric material are not limited in particular provided that the materials can be used generally as materials for piezoelectric actuator. The substrate material may be, for example, one of stainless steel (SUS430, SUS304, or the like), 42A alloy, alumina, zirconia, titanium and the like, or a mixture of not less than two of these materials. The piezoelectric material may be one of lead zirconate titanate (PZT), barium titanate, lead titanate, lead magnesium niobate (PMN), lead nickel niobate (PNN) and the like, or a mixture of not less than two of these materials.

In this case, since a mixture containing ceramic particles, which has a hardness great as compared with particles of conductive material (conductive particles) such as metal, is jetted onto the substrate, the ceramic particles contained in the jetted mixture embed into and adhere to a surface of the substrate due to the shock or impact upon colliding to the substrate. Accordingly, it is possible to improve the adherence between the substrate and the first electrode layer. Further, the first electrode layer contains oxide ceramics, homogenous with (equal in quality to) and having a high affinity for a piezoelectric material (mostly oxide ceramics) for forming the piezoelectric layer stacked on a surface of the first electrode layer. This improves the adherence between the first electrode layer and the piezoelectric layer, and thus any exfoliation hardly occurs between the first electrode layer and the piezoelectric layer due to the difference in coefficients of thermal expansion between these layers. As a result, the adherence can be improved between the layers constructing the piezoelectric actuator. Further, by mixing the ceramic particles with the particles of conductive material, it is possible to relatively reduce the use amount of the conductive material particles which are comparatively expensive, thereby reducing the production cost.

The method of producing the piezoelectric actuator of the prevent invention may further include, before the first electrode layer forming step, forming an diffusion-preventive layer, which prevents an element contained in the substrate from diffusing into the piezoelectric layer, by jetting an aerosol containing ceramic particles onto the substrate to adhere the ceramic particles to the substrate. In such a manner, when the ceramic particles which are comparatively hard are used as the particles for forming the diffusion-preventive layer, the ceramic particles embed in and adhere to the surface of the substrate due to the shock of collision on the substrate, and thus the diffusion-preventive layer adheres firmly to the substrate. Further, since the first electrode layer formed on the diffusion-preventive layer contains ceramic particles homogenous with and having high affinity for the ceramic particles forming the diffusion-preventive layer, the first electrode layer is highly adherent to the diffusion-preventive layer, thereby hardly causing any exfoliation between these layers due to the difference in the coefficients of thermal expansion therebetween. Thus, it is possible to ensure the adherence between a large number of stacked layers, thereby preventing the layer exfoliation. The ceramic particles forming the first electrode layer and the ceramic particles forming the diffusion-preventive layer may be of same kind or of different kinds. When different kinds of ceramic particles are used for forming these layers, it is sufficient that harder particles are used for forming an upper layer (layer to be formed after forming a lower layer to which the upper layer is adhered) than those forming the lower layer, in view of making the ceramic particles embed in a surface of the lower layer so that the upper layer can be firmly adhered to the lower layer.

In the method of producing the piezoelectric actuator of the present invention, the diffusion-preventive layer may be formed only at a portion at which the first electrode layer is to be formed. In this case, the diffusion-preventive layer is formed only at the portion of the substrate at which the first electrode layer is to be formed. Accordingly, at another portion of the substrate at which the diffusion-preventive layer is not formed, an element contained in the substrate diffuses into a portion of the piezoelectric layer corresponding to the another portion of the substrate, thereby lowering the piezoelectric characteristics of the portion of the piezoelectric layer corresponding to the another portion of the substrate where the diffusion-preventive layer is not formed. On the other hand, since the element contained in the substrate does not diffuse into the portion at which the diffusion-preventive layer is formed, it is possible to maintain the piezoelectric characteristics owing to the diffusion preventive layer, thereby suppressing the cross-talk.

The method of producing the piezoelectric actuator of the present invention may further include, after the first electrode layer forming step, forming a diffusion preventive layer which prevents an element contained in the first electrode layer from diffusing into the piezoelectric layer by jetting onto the first electrode layer an aerosol containing ceramic particles to adhere the ceramic particles to the first electrode layer. Since the diffusion preventive layer is formed of the ceramic particles homogenous with and having a high affinity for the ceramic particles contained in the first electrode layer, the diffusion preventive layer is highly adherent to the first electrode layer, and thus hardly causes any exfoliation due to the difference in coefficients of thermal expansion between the layers. Thus, it is possible to ensure the adherence between the layers, thereby avoiding the exfoliation. Also in the method of the present invention, the ceramic particles forming the first electrode layer and the ceramic particles forming the diffusion preventive layer may be of same kind or of different kinds. When different kinds of ceramic particles are used for these layers, it is sufficient that harder particles are used for forming an upper layer (layer to be formed after forming a lower layer to which the upper layer is adhered) than those forming the lower layer, for the purpose of making the ceramic particles embed in a surface of the lower layer to which the upper layer is adhered.

In the method of producing the piezoelectric actuator, a mixing ratio of the conductive particles may be 4 to 50 weight % in the first electrode layer forming step. With such a mixing rate, it is possible to realize both of securing the electric conductivity for the electrode layer with the particles of conductive material and of securing the adherence of the electrode layer by making the ceramic particles to embed in the lower layer.

According to a third aspect of the present invention, there is provided a method of producing a piezoelectric actuator, the method including:
forming a multilayer film by jetting an aerosol with an aerosol deposition method while changing one of a composition and a component of the aerosol;
performing an annealing treatment for the multilayer film; and
forming an electrode on the multilayer film.

In this case, the multilayer film is formed continuously while changing one of a composition and component(s) of the aerosol. Accordingly, it is possible to form the multilayer film more efficiently than in a method in which layers forming the multilayer film are formed in different steps respectively. Consequently, the process for producing the piezoelectric actuator can be efficient.

In the method of producing the piezoelectric actuator of the present invention, the step of forming the multilayer film may include:
forming a first electrode layer by jetting conductive particles and ceramic particles at a predetermined ratio;
forming an intermediate layer by jetting onto the first electrode layer an aerosol containing only ceramic particles; and
forming a second electrode layer by jetting onto the intermediate layer conductive particles and ceramic particles at a predetermined ratio. In this case, it is possible to form the first electrode layer, the intermediate layer, and the second electrode layer continuously while changing the ratio between the conductive particles (particles of conductive material) and the ceramic particles.

In the method of producing the piezoelectric actuator of the present invention, the ceramic particles for forming the intermediate layer may be piezoelectric ceramic particles.

In the method of producing the piezoelectric actuator of the present invention, the ceramic particles for forming the second electrode layer may be particles of one of alumina and zirconia; and the conductive particles for forming the second electrode layer may be particles of one of Ag and Au.

According to a fourth aspect of the present invention, there is provided a method of producing an ink-jet head constructed by joining a piezoelectric actuator produced by the producing method of the second aspect of the present invention and an ink-channel forming body provided with ink channels, the method including:
providing a metallic substrate as the substrate;
a step for forming the ink-channel forming body by forming holes which are to be the ink channels in a plurality of metallic plates formed of a same material as that of the metallic substrate, and by stacking and joining the metallic plates together; and
a joining step for joining the metallic substrate to an upper surface of the ink-channel forming body.

According to a fifth aspect of the present invention, there is provided a method of producing an ink-jet head constructed by joining a piezoelectric actuator, produced by the producing method in which a mixing ratio of the conductive particles is 4 to 50 weight % in the first electrode layer forming step, and an ink-channel forming body provided with ink channels, the method including:
providing a metallic substrate as the substrate;
a step for forming the ink-channel forming body by forming holes which are to be the ink channels in a plurality of metallic plates formed of a same material as that of the metallic substrate, and by stacking and joining the metallic plates together; and
a joining step for joining the metallic substrate to an upper surface of the ink-channel forming body.

In each of these cases, it is possible to ensure the adherence between the layers constructing the piezoelectric actuator even when the ink-jet head has fine or minute ink channels.

According to a sixth aspect of the present invention, there is provided a piezoelectric actuator including: a substrate; a first electrode layer formed on the substrate; a piezoelectric layer formed on the first electrode layer; and a second electrode layer formed on the piezoelectric layer; wherein a conductive material is dispersed in ceramic particles in the first electrode layer.

In this case, since the ceramic particles contained in the first electrode layer embed in and adhere to a surface of the substrate, the adherence between the first electrode layer and the substrate is improved. Further, the first electrode layer contains oxide ceramics homogenous with and having a high affinity for the piezoelectric material for forming the piezoelectric layer which is stacked on the surface of the first electrode layer. Accordingly, the adherence between the first electrode layer and the piezoelectric layer is improved and thus any exfoliation of these layers due to the difference in coefficients of thermal expansion therebetween hardly occurs. As a result, the adherence between the layers forming the piezoelectric actuator can be satisfactory. Further, by mixing the ceramic particles as a component for the first electrode layer, it is possible to relatively reduce the use amount of the particles of conductive material which are comparatively expensive, thereby reducing the production cost.

In the piezoelectric actuator of the present invention, the ceramic particles may be particles of one of alumina and zirconia; and the conductive particles may be particles of one of Ag and Au.

PREFERRED EMBODIMENTS OF THE INVENTION

First Embodiment

Figure 1:
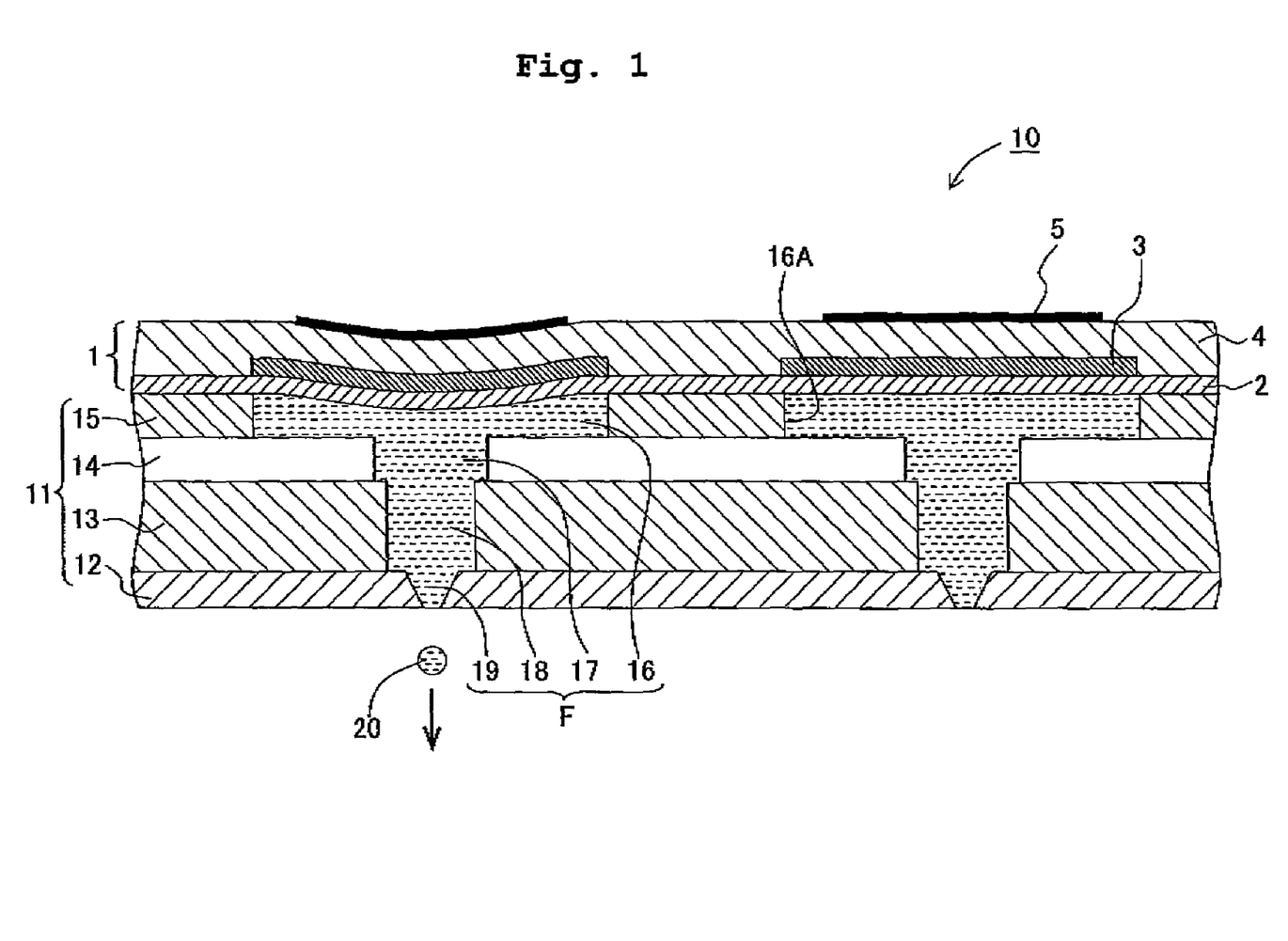
FIG. 1 is a sectional view of an ink-jet head according to a first embodiment of the present invention.

A first embodiment of the present invention will be explained below in detail with reference to FIGS. 1 to 4B. FIG. 1 shows an ink-jet head 10, according to this embodiment, which includes a channel unit 11 (an ink channel forming body) and an actuator plate 1 (a piezoelectric actuator). The channel unit 11 has a plurality of pressure chambers 16 in which an ink 20 is accommodated. The actuator plate 1 is joined to the channel unit 11 so as to close the pressure chambers 16.

The channel unit 11 as a whole is in the form of a flat plate in which a nozzle plate 12, a manifold plate 13, a channel plate 14, and a pressure-chamber plate 15 (each of these plates is a metallic plate) are stacked in layers in sequence, and the channel unit 11 has a construction in which the plates 12, 13, 14, and 15 are joined to one another with an epoxy-based thermosetting adhesive.

The nozzle plate 12 is formed of a polyimide-based synthetic resin material, and a plurality of ink-discharge nozzles 19 for jetting ink 20 are formed and aligned in the nozzle plate 12. The manifold plate 13 is formed, for example, of stainless steel (SUS430), and a plurality of nozzle channels 18 connected to the nozzles 19 respectively are provided in the manifold plate 13. The channel plate 14 is formed also of stainless steel (SUS430), and a plurality of pressure channels 17 communicating with the nozzle channels 18 respectively are provided in the channel plate 14. The pressure-chamber plate 15 is also formed of stainless steel (SUS430), and a plurality of pressure chambers 16 communicating with the pressure channels 17 respectively are provided in the pressure-chamber plate 15. The pressure chambers 16 are connected to an ink tank (not shown), via a manifold channel and a common ink chamber (not shown) provided in the manifold plate 13 and the channel plate 14 respectively. Thus, there are formed ink channels F each of which is from the common ink chamber connected to the ink tank to one of the ink-discharge nozzles 19, via the manifold channel, one of the pressure chambers 16, one of the pressure channels 17, and one of the nozzle channels 18.

The actuator plate 1, which is stacked on the channel unit 11, is constructed of a vibration plate 2 (substrate, metallic substrate) constructing a part of wall surface of each of the pressure chambers 16; lower electrodes 3 (first electrode layer) formed on the vibration plate 2; a piezoelectric layer 4 formed on the lower electrodes 3; and upper electrodes 5 (second electrode layer) provided on the piezoelectric film 3.

The vibration plate 2 is formed, for example, of stainless steel (SUS 430) in a rectangular shape, and the vibration plate 2 is joined to the upper surface of the channel unit 11 by thermo-compression bonding, and the vibration plate 2 is configured so as to cover the entire upper surface of the channel unit 11. The vibration plate 2 is formed of a metallic material which is same as that forming the manifold plate 13, the channel plate 14 and the pressure chamber plate 15 which construct the channel unit 11, thereby preventing the vibration plate 2 from warping when the vibration plate 2 is joined to the channel unit 11 by means of thermo-compression bonding. When the vibration plate 2 is formed of an electrically conductive material, the vibration plate 2 functions as a common electrode together with the lower electrodes 3.

The lower electrodes 3 are formed on a surface of the vibration plate 2 on a side opposite to the other surface of the vibration plate 2 facing the channel unit 11. The lower electrodes 3 are formed at and provided to positions (areas) each of which corresponds to an opening 16A of one of the pressure chambers 16, and are connected to ground of a driver IC (now shown). The lower electrodes 3 are formed of particles of a conductive material (conductive particulate material) M1 and ceramic particles M2 (see FIG. 4B) by the aerosol deposition method. The conductive material particles M1 function to secure the conductivity for the lower electrodes 3, and the ceramic particles M2 function to prevent an element included in the vibration plate 2 from diffusing into the piezoelectric layer 4 and function to secure adherence of the lower electrodes 3 to the piezoelectric layer 4.

The piezoelectric layer 4 is formed of a ferroelectric piezoelectric ceramics material such as lead zirconate titanate (PZT), and is stacked on the entire surface of the vibration plate 2 with substantially uniform thickness so as to sandwich the lower electrodes 3 between the piezoelectric layer 4 and the vibration plate 2. This piezoelectric layer 4 is formed by the aerosol deposition method, and subjected to a polarization treatment such that the piezoelectric layer 4 is polarized in a direction of thickness of the piezoelectric layer 4.

A plurality of upper electrodes 5 is provided on a surface, of the piezoelectric layer 4, on a reverse side of the other surface of the piezoelectric layer 4 at which the piezoelectric layer 4 is tightly adhered to the vibration plate 2. Each of the upper electrodes 5 is provided on the surface of the piezoelectric layer 4 at an area corresponding to an opening 16A one of the pressure chambers 16. The upper electrodes 5 are connected to the drive circuit IC, and are used as drive electrodes.

Upon performing a predetermined printing, a predetermined drive signal is outputted from the drive circuit IC to a certain upper electrode 5 of the upper electrodes 5, then electric potential of the upper electrode 5 becomes higher than an electric potential of a lower electrode 3 included in the lower electrodes 3 and corresponding to this upper electrode 5, and an electric field is applied in a polarization direction (direction of thickness) of the piezoelectric layer 4. Then, an area of the piezoelectric layer 4 sandwiched between the upper electrode 5 and the lower electrode 3 is expanded (extended) in the thickness direction and is contracted in a plane direction of the piezoelectric layer 4. Accordingly, the area of the piezoelectric layer 4 and an area of the vibration plate 2 (namely, the actuator plate 1) which correspond to an opening 16A of a pressure chamber 16 associated with the upper electrode 5 are locally deformed (unimorph deformation) to project toward the pressure chamber 16. Therefore, the volume of the pressure chamber 16 is lowered, a pressure of the ink 20 in the pressure chamber 16 is raised, and the ink 20 is jetted from the ink-discharge nozzle 19 of the pressure chamber 16. Thereafter, when the upper electrode 5 returns to an electric potential same as the electric potential of the lower electrode 3, the piezoelectric layer 4 and the vibration plate 2 restore to their original shape and the volume of the pressure chamber 16 returns to the original volume, thereby sucking the ink 20 from the manifold channel communicating with the ink tank.

Figure 2:
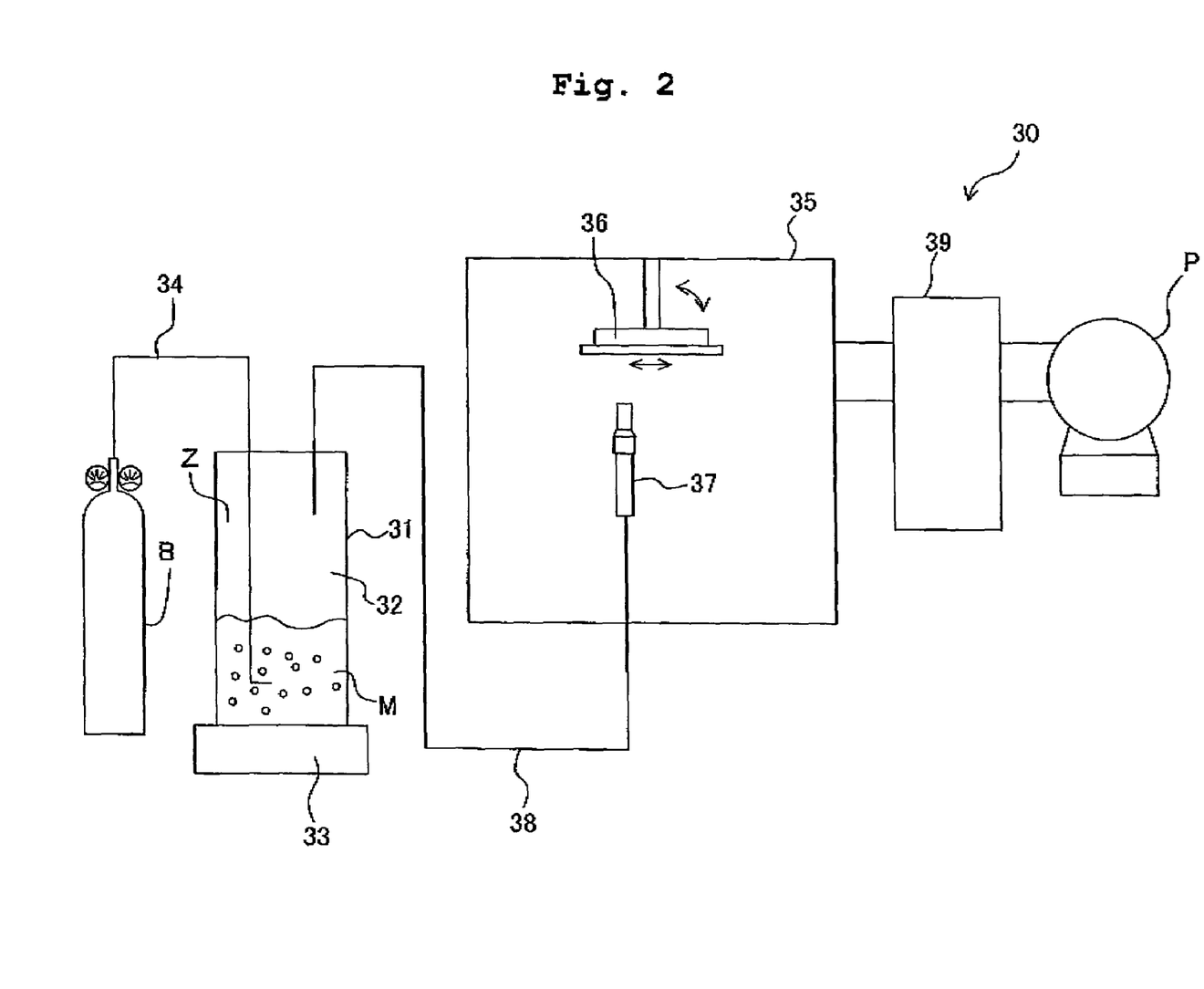
FIG. 2 is a schematic diagram of a film forming apparatus according to the first embodiment.

The lower electrodes 3 and the piezoelectric layer 4 are formed by the aerosol deposition method. FIG. 2 shows a schematic diagram of a film forming apparatus 30. This film forming apparatus 30 includes an aerosol generator 31 which forms an aerosol Z by dispersing material particles M in a carrier gas, and a film forming chamber 35 for adhering the aerosol Z on a substrate by jetting the aerosol Z from a jetting nozzle 37.

The aerosol generator 31 includes an aerosol chamber 32 capable of accommodating the material particles M inside thereof, and a vibration unit 33 which is attached to the aerosol chamber 32 and which causes the aerosol chamber 32 to vibrate. A gas cylinder B for introducing the carrier gas is connected to the aerosol chamber 32 via an introduction pipe 34. An end of the introduction pipe 34 is positioned near the bottom surface in the aerosol chamber 32 so that the end is buried in the material particles M. As the carrier gas, an inert gas such as helium, argon, and nitrogen, or a gas such as air and oxygen can be used.

The film forming chamber 35 includes a stage 36 for mounting the substrate where the piezoelectric layer will be formed, and the jetting nozzle 37 which is provided below the stage 36. The jetting nozzle 37 is connected to the aerosol chamber 32 via an aerosol supply pipe 38 so as to supply the aerosol Z in the aerosol chamber 32 to the jetting nozzle 37 through the aerosol supply pipe 38. Moreover, a vacuum pump P is connected to this film forming chamber 35 via a powder recovery unit 39 so that the inside of the film forming chamber 35 can be decompressed.

Next, an explanation will be given below about a method of producing an actuator plate 1 for an ink-jet head 10 by using the film forming apparatus 30.

Figure 3A:
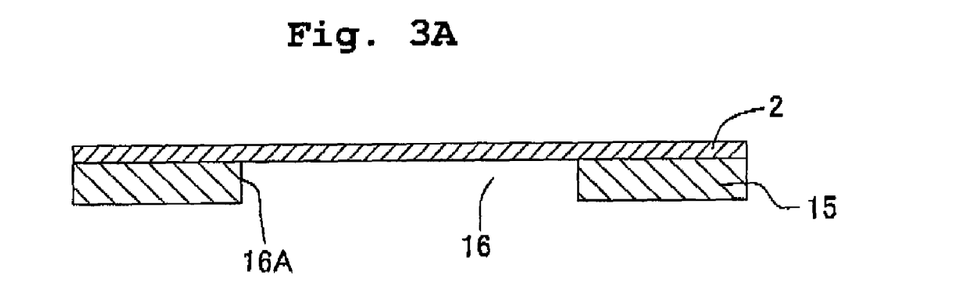
FIG. 3A is a sectional view showing a state in which a vibration plate is joined to an ink channel forming body in a process for producing an actuator plate according to the first embodiment.

First, as shown in FIG. 3A, the vibration plate 2 formed of stainless steel is overlapped with the channel unit 11, while being positioned on the upper surface of the pressure chamber plate 15 in the channel unit 11, and joined to the pressure chamber plate 15 by means of thermo-compression bonding, thereby closing the pressure chambers 16 by the vibration plate 2.

Figure 3B:
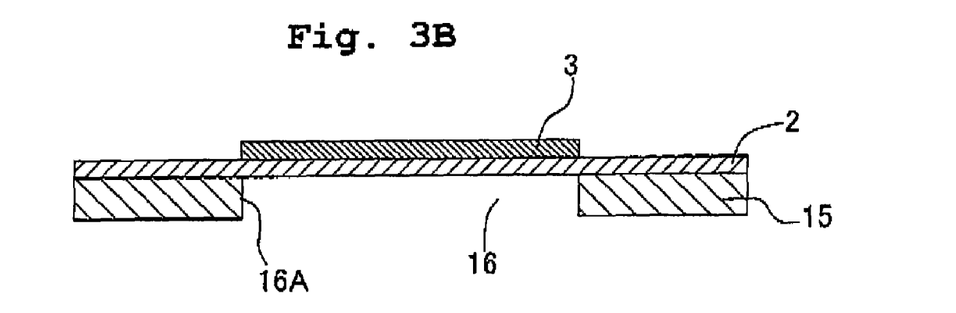
FIG. 3B is a sectional view showing a state in which a lower electrode is formed in this process.

Next, as shown in FIG. 3B, lower electrodes 3, which serve also as a diffusion-preventive layer are formed on the vibration plate 2 (first electrode layer forming step). The lower electrodes 3 are formed by the aerosol deposition method (AD method). First, portions on the upper surface of the vibration plate 2 each of which is located out of the opening 16A of one of the pressure chambers 16 is masked (not shown) by a known method. Subsequently, the vibration plate 2 is set on the stage 36 of the film forming apparatus 30. Subsequently, a mixture of the conductive material particles M1 and the ceramic particles M2 are charged, into the aerosol chamber 32, as the material particles M.

Then, the carrier gas is introduced from the gas cylinder B so that the material particles M are made to rise up by gas pressure. At the same time, the aerosol chamber 32 is vibrated by the vibration unit 33, thereby mixing the material particles M with the carrier gas to generate the aerosol Z. Further, the inside of the film forming chamber 35 is decompressed by the vacuum pump P to generate pressure difference between the aerosol chamber 32 and the film forming chamber 35. Due to the pressure difference, the aerosol Z in the aerosol chamber 32 is jetted from the jetting nozzle 37 while accelerating the aerosol to a high velocity. The material particles M contained in the jetted aerosol Z are collided on the vibration plate 2 and deposited on the vibration plate 2, thereby forming a layer of the lower electrodes 3.

Figure 4A:
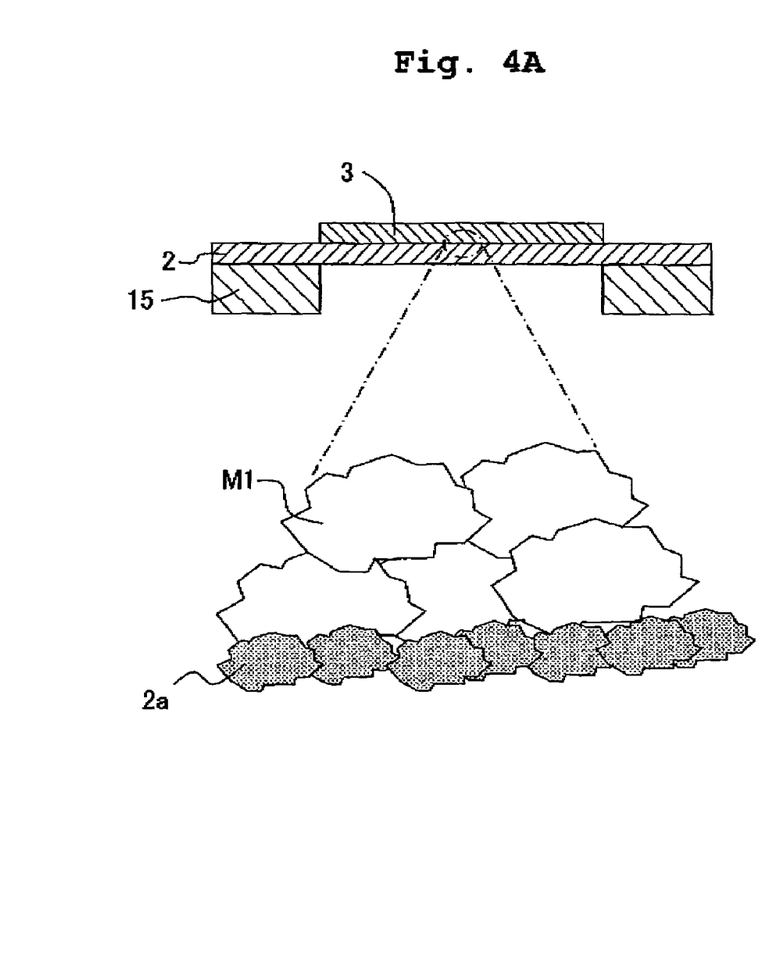
FIG. 4A is a partially enlarged sectional view of an interface between a vibration plate and a lower electrode in a case that no ceramic particles are mixed.
Figure 4B:
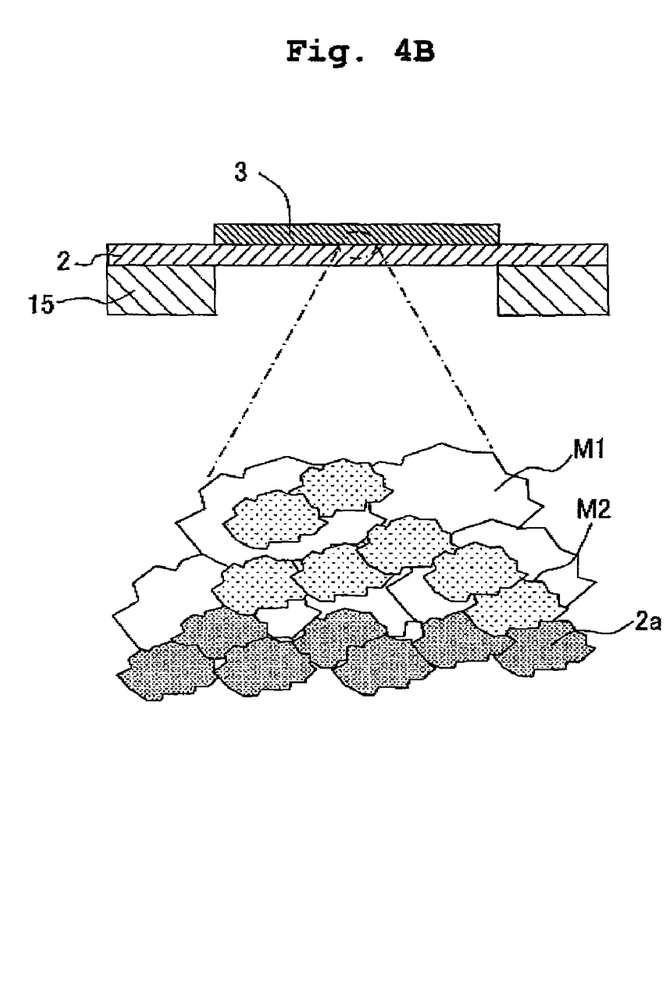
FIG. 4B is a partially enlarged sectional view of an interface between a vibration plate and a lower electrode in a case that ceramic particles are mixed.

When the material particles M are formed of metallic particles or the like which are relatively soft, the material particles M cannot embed in the vibration plate 2 when the material particles M collide on the vibration plate 2. Consequently, any sufficient anchor layer is not formed, resulting in low or weak adherence between the lower electrodes 3 and the vibration plate 2. In such a case, as conceptually shown in FIG. 4A, a clear boundary exists between the conductive material particles M1 and the particles 2a forming the vibration plate 2. This embodiment, however, has a fine structure in which the ceramic particles M2 included in the material particles M and having an appropriate hardness collide on the vibration plate 2 at high speed so as to be pulverized or crushed into fine particles to be embedded in the vibration plate 2 at an appropriate extent. As shown in FIG. 4B, even in the boundary between the lower electrodes 3 and the vibration plate 2, some of the particles M1 and M2 are embedded in the particles 2a of the vibration plate 2. This makes it possible to form a highly adherent layer having a fine particle boundary surface.

Figure 3C:
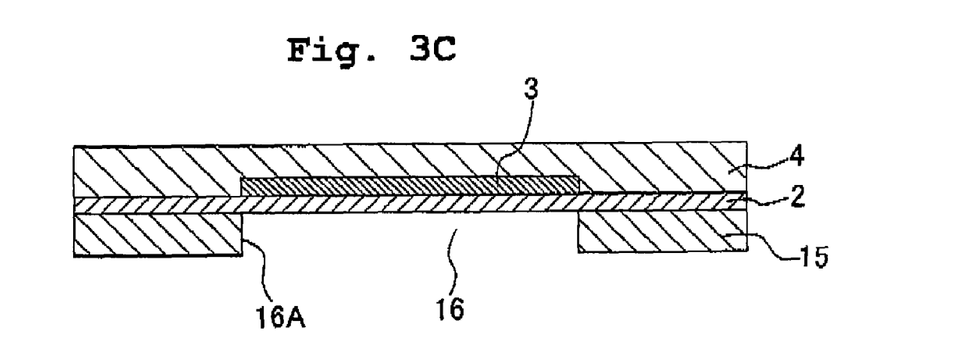
FIG. 3C is a sectional view showing a state in which a piezoelectric layer is formed in this process.

Subsequently, the masking is removed from the vibration plate 2, and as shown in FIG. 3C, a piezoelectric layer 4 is formed by the aerosol deposition (AD) method (piezoelectric layer forming step). First, the vibration plate 2 on which the lower electrodes 3 have been formed is set on the stage 36 in the film forming apparatus 30. Subsequently, particles of a piezoelectric material as material particles M are charged into the aerosol chamber 32.

Then, aerosol Z is generated in a similar manner as in the first electrode layer forming step, and the aerosol Z is jetted onto the vibration plate 2. The material particles M contained in the jetted aerosol Z collide to the vibration plate 2 and are deposited on the vibration plate 2, thereby forming a piezoelectric layer 4. In this case, the lower electrodes 3 consequently contain ceramic particles M2 homogenous with and having a high affinity for oxide ceramics as the piezoelectric material of which the piezoelectric layer 4 is formed. Accordingly, this improves the adherence between the lower electrodes 3 and the piezoelectric layer 4.

Subsequently, an annealing treatment is performed for the formed piezoelectric layer 4 for obtaining required piezoelectric characteristics for the piezoelectric layer. At this time, the metallic elements such as Fe, Cr and the like contained in the vibration plate 2 of stainless steel diffuse (attempt to diffuse) into the piezoelectric layer 4. However, the lower electrodes 3, which serves also as the diffusion-preventive layer, are provided on the vibration plate 2 at areas each corresponding to an opening 16A of one of the pressure chambers 16, namely at areas which are warped when being applied with a voltage. Therefore, the metallic elements in the vibration plate 2 do not diffuse into the piezoelectric layer 4 at areas provided with the lower electrodes 3 respectively. Accordingly, it is possible to maintain the piezoelectric characteristics of the portions of the piezoelectric layer 4 which are warped when voltage is applied. In addition, by making the ceramic particles M2 contained in the lower electrodes 3, the adherence between the vibration plate 2 and the lower electrodes 3, and the adherence between the lower electrodes 3 and the piezoelectric layer 4 are satisfactory (tightly adhered), thereby preventing any exfoliation of the layers which would be otherwise caused due to the thermal shocks.

Figure 3D:
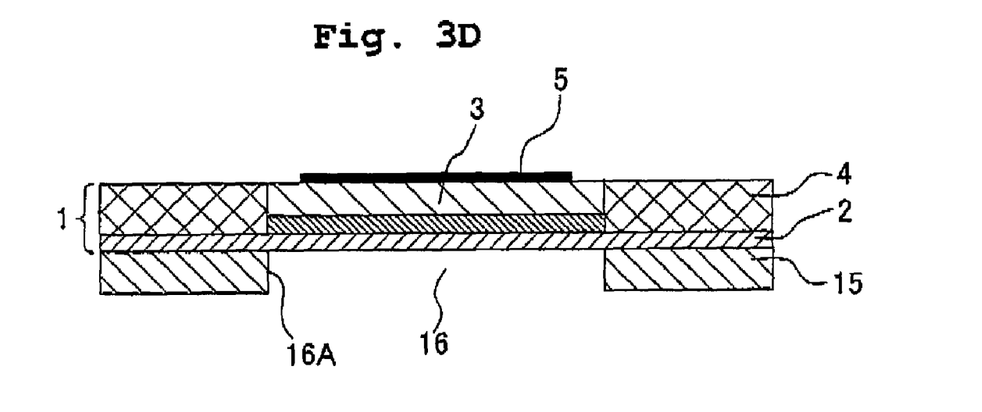
FIG. 3D is a sectional view showing a state in which an upper electrode is formed in this process.

Next, as shown in FIG. 3D, the upper electrodes 5 and a plurality of lead portions (not shown in the diagram) connected to the upper electrodes 5 respectively are formed on the upper surface of piezoelectric layer 4. For forming the upper electrodes 5 and the lead portions, for example, after forming a conductor film on the entire area of the piezoelectric layer 4, the upper electrodes 5 may be formed in a predetermined pattern by using a photolithographic etching method. Alternatively, the upper electrodes 5 may be formed by screen printing in a predetermined pattern directly on the upper surface of the piezoelectric layer 4.

Afterwards, an electric field stronger than at the time of a normal ink-jetting operation is applied between the upper electrodes 5 and the lower electrode 3, and the piezoelectric layer 4 between both of the electrodes is polarized in the direction of thickness of the piezoelectric layer 4 (Polarizing treatment). Thus, the actuator plate 1 is completed.

According to this embodiment, as described above, the lower electrodes 3 are formed by jetting aerosol Z containing the conductive material particles M1 and the ceramic particles M2 onto the vibration plate 2 so as to make the particles adhere to the vibration plate 2. In such a manner, when the ceramic particles M2, which are hard and mixed with the conductive material particles M1 are jetted onto the vibration plate 2, the collision shock causes the ceramic particles M2 to embed in and adhere to a surface of the vibration plate 2, thereby making it possible to improve the adherence between the vibration plate 2 and the lower electrodes 3. In addition, the lower electrodes 3 consequently contain oxide ceramics homogenous to the oxide ceramics of which the piezoelectric layer 4 is formed. As a result, the adherence is improved between the lower electrodes 3 and the piezoelectric layer 4, and any exfoliation hardly occurs between the lower electrodes 3 and the piezoelectric layer 4 due to the difference in the coefficients of thermal expansion between the lower electrodes 3 and the piezoelectric layer 4. Thus, it is possible to improve the adherence between the layers forming or constructing the actuator plate 1. In addition, by mixing the ceramic particles M2 with the conductive material particles M1, it is possible to relatively reduce the use amount of the conductive material particles M1 which are comparatively expensive, thereby reducing the production cost.

Furthermore, particles effective in preventing the diffusion are used as the ceramic particles M2, so that the lower electrodes 3 can serve also as the diffusion-preventive layer. Accordingly, there is no need to perform a step for forming a diffusion-preventive layer separately, thus simplifying the production process.

Second Embodiment

A second embodiment of the present invention will be explained below with reference to FIGS. 5A to 6B. The second embodiment differs from the first embodiment in having, in an actuator plate 41, a diffusion-preventive layer 46 interposed (provided) between a vibration plate 42 and one of lower electrodes 43. Same reference numerals are designated for parts or components of the second embodiment similar to those in the first embodiment, and explanation therefor will be omitted as appropriate.

Figure 6A:
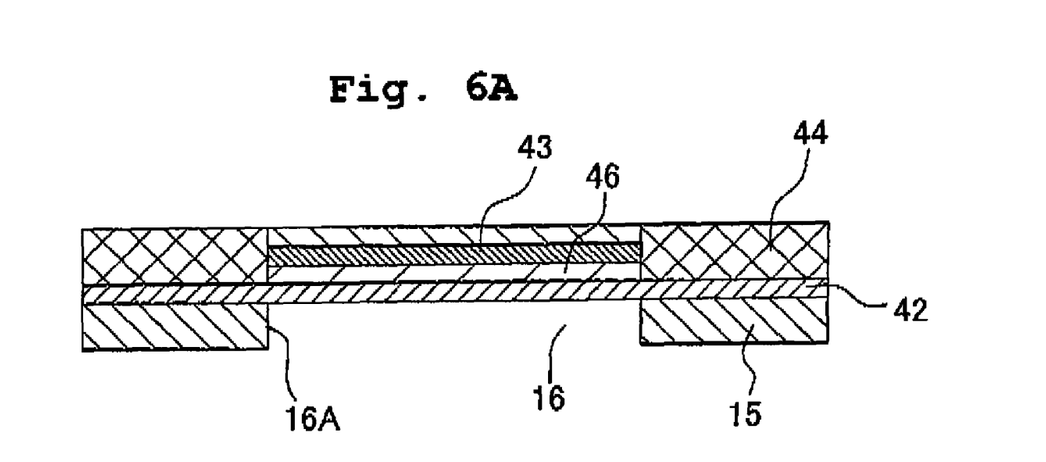
FIG. 6A is a sectional view showing a state in which an annealing treatment is performed in the process of producing the actuator plate according to the second embodiment.
Figure 6B:
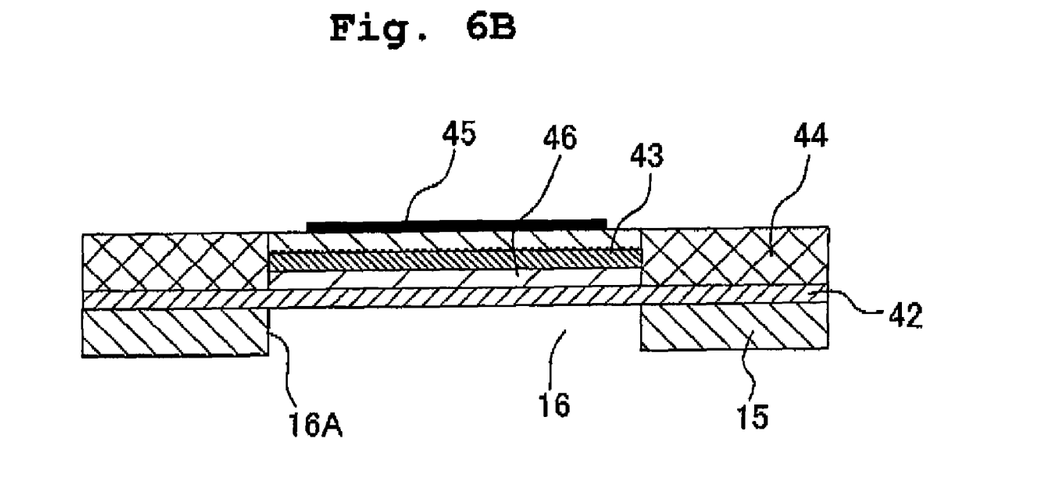
FIG. 6B is a sectional view showing a state in which an upper electrode is formed in this process.

An actuator plate 41 according to this embodiment as shown in FIG. 6B is used for an ink-jet head similarly in the first embodiment. The actuator plate 41 is provided with a vibration plate 42 constructing a part of wall surface of each of the pressure chambers 16. Diffusion preventive layers 46 provided on the vibration plate, lower electrodes 43 stacked on the diffusion prevention layers 46 respectively, a piezoelectric layer 44 stacked on the lower electrodes 43, and upper electrodes 45 provided on the piezoelectric layer 44 are provided on the vibration plates 42.

Figure 5A:
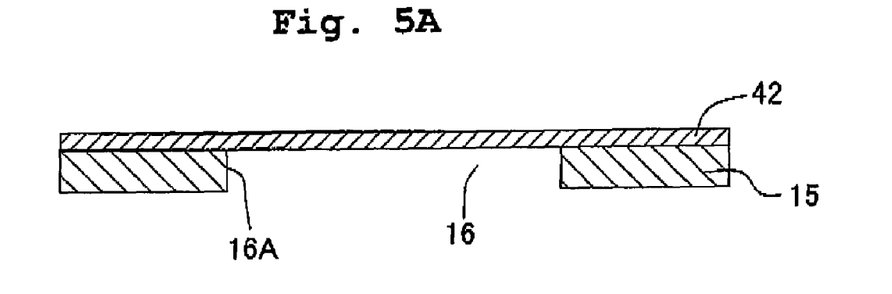
FIG. 5A is a sectional view showing a state in which a vibration plate is joined to an ink channel forming body in a process for producing an actuator plate according to a second embodiment of the present invention.

For producing the actuator plate 41 of this embodiment, firstly, similarly in the first embodiment, the vibration plate 42 is overlapped with a pressure chamber plate 15, while being positioned on the upper surface of the pressure chamber plate 15, and joined to the pressure chamber plate 15, thereby closing the pressure chambers 16 by the vibration plate 42 (see FIG. 5A).

Figure 5B:
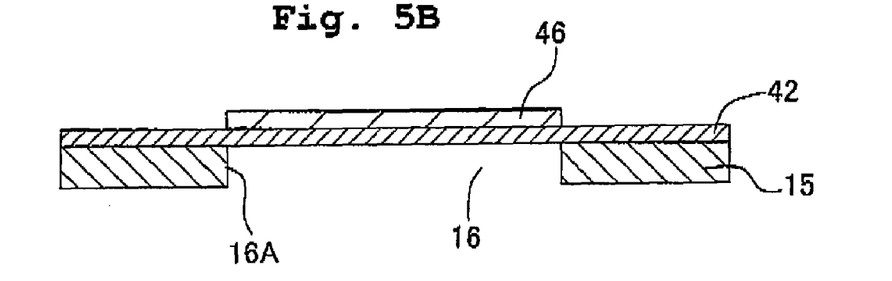
FIG. 5B is a sectional view showing a state in which an diffusion preventive layer is formed in this process.

Next, in the diffusion-preventive layer forming step, diffusion-preventive layers 46 are formed on the vibration plate 42 at areas each corresponding to an opening 16A of one of the pressure chambers 16 (see FIG. 5B). The diffusion-preventive layers 46 are formed by the aerosol deposition (AD) method by using a film forming apparatus 30 similar to that used in the first embodiment. The second embodiment uses, as the material particles M, particles of oxide ceramics (for example, alumina) which have a diffusion-preventing function for preventing an element contained in the vibration plate 42 from diffusing into the piezoelectric layer 44. In this case, since the ceramic particles are comparatively high in hardness, the ceramic particles embed in and adhered to a surface of the vibration plate 42 due to the collision shock or impact. This causes the vibration plate 42 and the diffusion-preventive layers 46 to adhere strongly with each other.

Figure 5C:
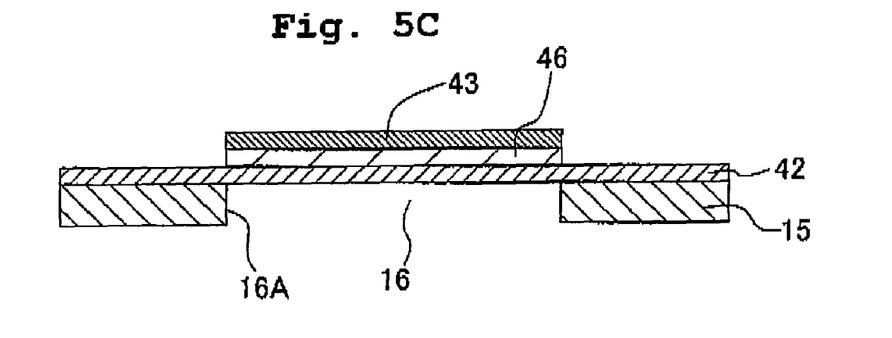
FIG. 5C is a sectional view showing a state in which a lower electrode is formed in this process.
Figure 5D:
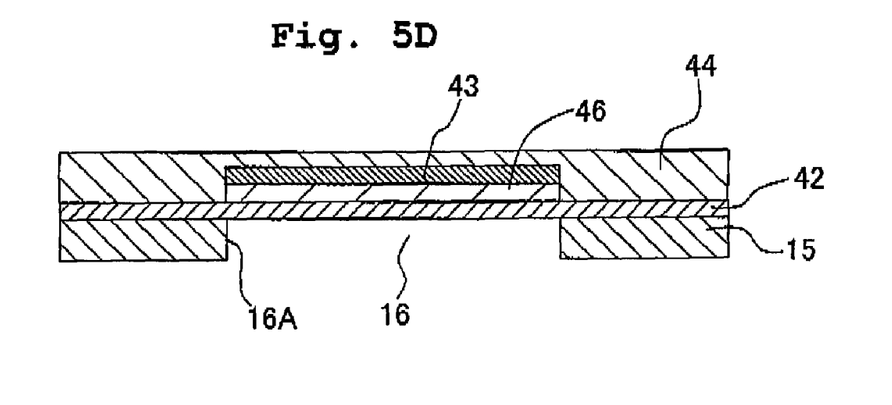
FIG. 5D is a sectional view showing a state in which a piezoelectric layer is formed in this process.

Next, as shown in FIGS. 5C and 5D, lower electrodes 43 and a piezoelectric layer 44 are formed on the surface of the vibration plate 42, on which the diffusion-preventive layers 46 have been formed. The lower electrodes 43 and the piezoelectric layer 44 are formed by the aerosol deposition (AD) method by using the film forming apparatus 30 similar to that used in the first embodiment. The diffusion-preventive layers 46 are formed of oxide ceramics, homogenous with and having a high affinity for the oxide ceramics (ceramic particles M2) contained in the lower electrodes 43, thereby improving the adherence between the diffusion-preventive layers 46 and the lower electrodes 43. Further, as described in the first embodiment, the lower electrodes 43 contain the ceramic particles M2, homogenous with and having a high affinity for oxide ceramics as the piezoelectric material of which the piezoelectric layer 44 is formed. As a result, the adherence between the lower electrodes 43 and the piezoelectric layer 44 is improved.

Subsequently, as shown in FIG. 6A, an annealing treatment is performed for the formed piezoelectric layer 44. At this time, since the diffusion-preventive layers 46 are provided on the vibration plate 42 at areas each of which corresponds to the opening 16A of one of the pressure chambers 16, namely at areas of the vibration plate 42 which are warped by the application of voltage, the metallic element contained in the vibration plate 42 is prevented from diffusing into the piezoelectric layer 44 owing to these diffusion preventive layers 44. Accordingly, similarly in the first embodiment, it is possible to maintain the piezoelectric characteristics at the portions of the piezoelectric layer 44 which are deformed to warp the vibration plate when voltage is applied. In addition, since the adherence between the vibration plate 42 and the diffusion-preventive layers 46, the adherence between the diffusion-preventive layers 46 and the lower electrodes 43, and the adherence between the lower electrodes 43 and the piezoelectric layer 44 are great (strong), it is possible to prevent any exfoliation from occurring between these layers and electrodes due to the thermal shock.

Subsequently, as shown in FIG. 6B, upper electrodes 45 are formed similarly in the first embodiment, and then polarization treatment is performed, thereby completing the actuator plate 41.

In this embodiment, as described above, even when a large number of layers such as the diffusion-preventive layers 46, the lower electrodes 43, and the piezoelectric layer 44 are stacked, it is possible to secure the adherence between the layers, and thus prevent the layer exfoliation.

In the following, the present invention will be explained in more detail by examples.

EXAMPLE 1-1

1. Formation of Lower Electrodes and a Piezoelectric Layer (1) Lower Electrodes

Figure 7:
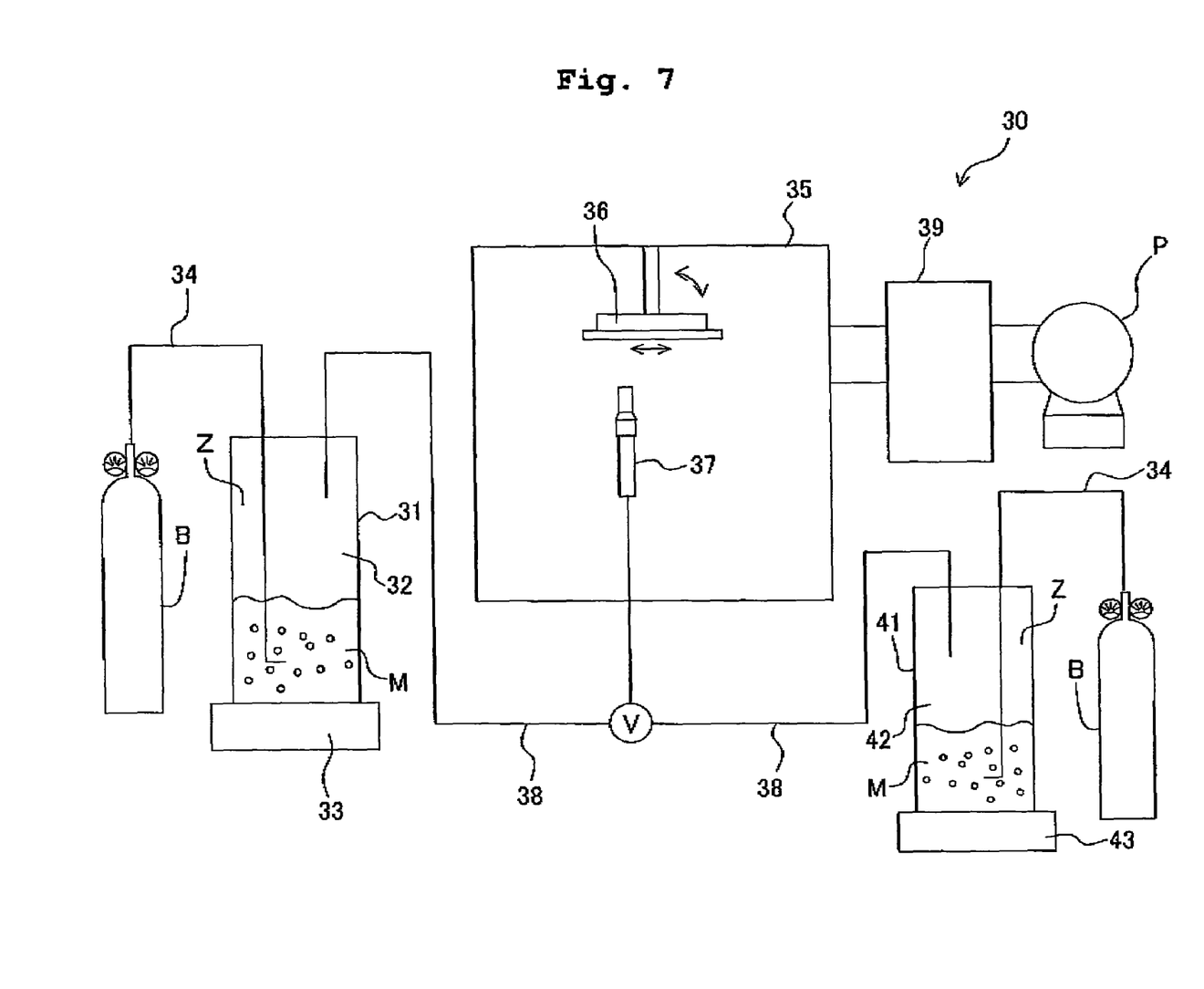
FIG. 7 is a schematic diagram of the film forming apparatus used in examples of the present invention.

As the film forming apparatus, an apparatus as shown in FIG. 7 which is similar to that as shown in FIG. 2 and used in the embodiments as described above but further includes a second aerosol generator 41 and another gas cylinder was used for this example. Similar to the first aerosol generator 31, the second aerosol generator 41 also includes an aerosol chamber 42 capable of accommodating the material particles M inside thereof, and a vibration unit 43 which is attached to the aerosol chamber 42 and which causes the aerosol chamber 42 to vibrate. The gas cylinder B for introducing the carrier gas is connected to the aerosol chamber 42 via an introduction pipe 34. First, as the substrate, this example used a stainless steel plate (SUS430) in which an alumina layer having a thickness of 1 to 3 μm has been formed in a surface of the stainless steel plate; and a mixture in which alumina powder having a mean particle diameter of 0.3 to 1 μm and Ag powder was mixed at a mixing ratio of 99:1 was accommodated as the material particle M for the lower electrode in the first aerosol chamber 32. The aerosol generated in the first aerosol generator 31 was jetted onto the alumina layer on the substrate with the following condition that nozzle opening was 0.4 mm×10 mm, pressure in the film forming chamber was 200 Pa, pressure in the aerosol chamber was 30,000 Pa, the kind of carrier gas was He, gas flow rate was 4.5 litter/min, the distance between nozzle and substrate was 10 to 20 mm. Thus, a lower electrode layer was formed in the AD method. The thickness of the lower electrode layer, measured by step (unevenness) measurement with a surface roughness tester was approximately 1 to 2 μm.

(2) Piezoelectric Layer

With reference to FIG. 7, a valve V was switched to connect the nozzle 37 to the second aerosol generator 41 so as to form a piezoelectric layer. The piezoelectric layer was formed by the AD method by jetting an aerosol containing PZT powder having a mean particle diameter of 0.3 to 1 μm from the second aerosol generator 41 onto the lower electrode layer formed as described above, under the same condition as in above (1). The thickness of the piezoelectric layer, measured by step (unevenness) measurement with a surface roughness tester was approximately 8 μm.

(3) Annealing Treatment

Subsequently, the formed piezoelectric layer was subjected to annealing treatment. Temperature in a muffle furnace (FP100, manufactured by Yamato Scientific Co., Ltd.), was raised up to 850° C., and the substrate having the piezoelectric layer formed thereon was placed in the furnace. After holding the substrate in the furnace for a predetermined period of time, the substrate was taken out of the furnace and was cooled by natural cooling down to the room temperature.

2. Measurement

The formed lower electrode layer, and the formed piezoelectric layer were observed visually. The surface resistance of the lower electrodes was measured with a resistance meter (Digital Multimeter CDM-170).

EXAMPLE 1-2

Lower electrodes and a piezoelectric layer were formed and measured in a similar manner as in Example 1-1 except that the alumina powder and the Ag powder were mixed at a mixing ratio of 98:2.

EXAMPLE 1-3

Lower electrodes and a piezoelectric layer were formed and measured in a similar manner as in Example 1-1 except that the alumina powder and the Ag powder were mixed at a mixing ratio of 96:4.

EXAMPLE 1-4

Lower electrodes and a piezoelectric layer were formed and measured in a similar manner as in Example 1-1 except that the alumina powder and the Ag powder were mixed at a mixing ratio of 90:10.

EXAMPLE 1-5

Lower electrodes and a piezoelectric layer were formed and measured in a similar manner as in Example 1-1 except that the alumina powder and the Ag powder were mixed at a mixing ratio of 70:30.

EXAMPLE 1-6

Lower electrodes and a piezoelectric layer were formed and measured in a similar manner as in Example 1-1 except that the alumina powder and the Ag powder were mixed at a mixing ratio of 50:50.

EXAMPLE 2-1

As the material for the lower electrodes, a mixture in which Zirconia power and Ag powder were mixed at a mixing ratio of 99:1. Other than this, lower electrodes and a piezoelectric layer were formed and measured in a similar manner as in Example 1-1.

EXAMPLE 2-2

Lower electrodes and a piezoelectric layer were formed and measured in a similar manner as in Example 2-1 except that the zirconia powder and the Ag powder were mixed at a mixing ratio of 98:2.

EXAMPLE 2-3

Lower electrodes and a piezoelectric layer were formed and measured in a similar manner as in Example 2-1 except that the zirconia powder and the Ag powder were mixed at a mixing ratio of 96:4.

EXAMPLE 2-4

Lower electrodes and a piezoelectric layer were formed and measured in a similar manner as in Example 2-1 except that the zirconia powder and the Ag powder were mixed at a mixing ratio of 90:10.

EXAMPLE 2-5

Lower electrodes and a piezoelectric layer were formed and measured in a similar manner as in Example 2-1 except that the zirconia powder and the Ag powder were mixed at a mixing ratio of 70:30.

EXAMPLE 2-6

Lower electrodes and a piezoelectric layer were formed and measured in a similar manner as in Example 2-1 except that the zirconia powder and the Ag powder were mixed at a mixing ratio of 50:50.

EXAMPLE 3-1

As the material for the lower electrodes, a mixture in which alumina power and Au powder were mixed at a mixing ratio of 99:1. Other than this, lower electrodes and a piezoelectric layer were formed and measured in a similar manner as in Example 1-1.

EXAMPLE 3-2

Lower electrodes and a piezoelectric layer were formed and measured in a similar manner as in Example 3-1 except that the alumina powder and the Au powder were mixed at a mixing ratio of 98:2.

EXAMPLE 3-3

Lower electrodes and a piezoelectric layer were formed and measured in a similar manner as in Example 3-1 except that the alumina powder and the Au powder were mixed at a mixing ratio of 96:4.

EXAMPLE 3-4

Lower electrodes and a piezoelectric layer were formed and measured in a similar manner as in Example 3-1 except that the alumina powder and the Au powder were mixed at a mixing ratio of 90:10.

EXAMPLE 3-5

Lower electrodes and a piezoelectric layer were formed and measured in a similar manner as in Example 3-1 except that the alumina powder and the Au powder were mixed at a mixing ratio of 70:30.

EXAMPLE 3-6

Lower electrodes and a piezoelectric layer were formed and measured in a similar manner as in Example 3-1 except that the alumina powder and the Au powder were mixed at a mixing ratio of 50:50.

COMPARATIVE EXAMPLE 1

Ag powder without being mixed with alumina powder was used as a lower electrode material. Other than this, lower electrodes and a piezoelectric layer were formed and measured in a similar manner as in Example 1-1.

COMPARATIVE EXAMPLE 2

A thin Ag film having a thickness of 0.5 μm was formed as the lower electrode layer on a substrate by sputtering. Other than this, lower electrodes and a piezoelectric layer were formed and measured in a similar manner as in Example 1-1.

COMPARATIVE EXAMPLE 3

A thin TiAg film having a thickness of 0.5 μm was formed as the lower electrode layer on a substrate by sputtering. Other than this, lower electrodes and a piezoelectric layer were formed and measured in a similar manner as in Example 1-1.

Results and Evaluation

Table 1 shows the mixing ratios of alumina powder to Ag powder, the results of observation of the formed lower electrodes and the formed piezoelectric layer, and the surface electrical resistances measured after the lower electrodes were formed, and after the piezoelectric layer was annealed, in each of Examples 1-1 to 1-6 and Comparative Example 1.

Similarly, Tables 2 and 3 show the mixing ratios, observation results, and surface resistances for each of Examples 2-1 to 2-6 and 3-1 to 3-6. In these examples, it is possible to complete a piezoelectric actuator by forming upper electrodes on the annealed piezoelectric layer by means of screen printing or the like.

TABLE 1

| | Alumina wt % | Ag wt % | After lower electrode formation | | After piezoelectric layer formation | |
|---|---|---|---|---|---|---|
| | | | formed films | surface resistance | formed film | surface resistance |
| Ex. 1-1 | 99 | 1 | highly adherent | not less than 20 MΩ | highly adherent | not less than 20 MΩ |
| Ex. 1-2 | 98 | 2 | highly adherent | 0.6 MΩ | highly adherent | not less than 20 MΩ |
| Ex. 1-3 | 96 | 4 | highly adherent | 0.5 MΩ | highly adherent | 0.5 MΩ |
| Ex. 1-4 | 90 | 10 | highly adherent | 0.4 MΩ | highly adherent | 0.4 MΩ |
| Ex. 1-5 | 70 | 30 | highly adherent | 0.4 MΩ | highly adherent | 0.4 MΩ |
| Ex. 1-6 | 50 | 50 | highly adherent | 0.4 MΩ | highly adherent | 0.4 MΩ |
| Comp. Ex. 1 | 0 | 100 | no adhesion | — | — | — |

TABLE 2

| | Zirconia wt % | Ag wt % | After lower electrode formation | | After piezoelectric layer formation | |
|---|---|---|---|---|---|---|
| | | | formed films | surface resistance | formed film | surface resistance |
| Ex. 2-1 | 99 | 1 | highly adherent | not less than 20 MΩ | highly adherent | not less than 20 mΩ |
| Ex. 2-2 | 98 | 2 | highly adherent | 0.6 MΩ | highly adherent | not less than 20 MΩ |
| Ex. 2-3 | 96 | 4 | highly adherent | 0.5 MΩ | highly adherent | 0.5 MΩ |
| Ex. 2-4 | 90 | 10 | highly adherent | 0.4 MΩ | highly adherent | 0.4 MΩ |
| Ex. 2-5 | 70 | 30 | highly adherent | 0.4 MΩ | highly adherent | 0.4 MΩ |
| Ex. 2-6 | 50 | 50 | highly adherent | 0.4 MΩ | highly adherent | 0.4 MΩ |

TABLE 3

|  | Alumina wt % | Au wt % | After lower electrode formation | | After piezoelectric layer formation | |
|---|---|---|---|---|---|---|
|  |  |  | formed films | surface resistance | formed film | surface resistance |
| Ex. 3-1 | 99 | 1 | highly adherent | not less than 20 MΩ | highly adherent | not less than 20 MΩ |
| Ex. 3-2 | 98 | 2 | highly adherent | 0.6 MΩ | highly adherent | not less than 20 MΩ |
| Ex. 3-3 | 96 | 4 | highly adherent | 0.5 MΩ | highly adherent | 0.4 MΩ |
| Ex. 3-4 | 90 | 10 | highly adherent | 0.4 MΩ | highly adherent | 0.3 MΩ |
| Ex. 3-5 | 70 | 30 | highly adherent | 0.4 MΩ | highly adherent | 0.3 MΩ |
| Ex. 3-6 | 50 | 50 | highly adherent | 0.4 MΩ | highly adherent | 0.3 MΩ |

In Comparative Example 1, in which Ag powder was used as the material for the lower electrode layer, without alumina powder mixed thereinto, the Ag powder did not adhere to the alumina layer of the substrate by the AD method. Therefore, no film could be formed. In each of Comparative Examples 2 and 3, in which the lower electrode layer was formed by sputtering, the lower electrode layer and the alumina layer of the substrate were exfoliated from each other when the piezoelectric layer was formed thereabove. The exfoliation is considered to have been caused by the collision stress of the piezoelectric particles when the piezoelectric layer was formed. From this, it is appreciated that the adherence between the lower electrode layer and the substrate was not sufficient.

On the other hand, in each of Examples 1-1 to 1-6, in which the mixture of alumina powder and Ag powder was used as the material for the lower electrode layer, no exfoliation was observed after the lower electrode layer was formed and after the piezoelectric layer was formed. Accordingly, it is appreciated that the substrate and the lower electrode layer adhered strongly to each other, and that the lower electrode layer and the piezoelectric layer adhered strongly to each other. The surface electrical resistance of the lower electrode layer was not more than 0.6Ω when Ag powder was mixed by not less than 2 wt %. From this, it is appreciated that the mixture of about 2 wt % particles of conductive material made the lower electrodes sufficiently conductive. After the piezoelectric layer was annealed, although there was no great difference in surface electrical resistance in cases each containing Ag powder by not less than 4 wt %, the surface electrical resistance was as high as not less than 20 MΩ in cases each containing Ag power by 2 wt %. This phenomena is considered to have occurred because the lower electrode layer became electrically less conductive as the annealing treatment makes Ag diffuse into the piezoelectric layer and/or to the alumina layer of the substrate. Accordingly, in consideration of the diffusion caused by the annealing treatment, it is preferable that the ratio of particles of conductive material is not less than 4 wt %.

Further, regarding the ceramic particles, when the ceramic particles were mixed at the mixing ratio of not less than 50%, sufficient adherence can be obtained (Examples 1-1 to 1-6). In view of lowering the production cost by relatively reducing an use amount of the comparatively expensive particles of conductive material, it is preferable that the mixing ratio of ceramic particles is not less than 50%, and as high as possible to an extent without adversely affecting the electric conductivity of the electrodes.

In Examples 2-1 to 2-6, in which zirconia particles replaced ceramic particles, and in Examples 3-1 to 3-6, in which the particles of conductive material were Au, the results did not differ greatly from those in Examples 1-1 to 1-6. When the particles of conductive material are a material which diffuses in a large amount when subjected to annealing treatment, it is considered preferable that the ratio of the conductive particles be higher than that for Ag or Au. Although no detailed data is shown, when the particles of conductive material are Fe or Cr, for example, it is considered that about 10 wt % of the particles of conductive material can ensure electric conductivity.

The scope of the present invention is not intended to be limited by the embodiments as described above. For example, the following configurations are also included into the scope of the present invention. Further, the scope of the present invention also encompasses the range of equivalents.

In each of the embodiments, a stainless steel substrate is used as the vibration plate 2, 42. In the present invention, the material for the substrate is not limited to those in the embodiments, but a ceramic substrate such as an alumina substrate may be used. When the substrate is an alumina substrate or the like, the diffusion preventive layer can be omitted since no diffusion occurs from the ceramic substrate when the annealing treatment is performed.

In each of the embodiments, insulative ceramic powder is mixed in the lower electrodes 3, 43. There is a possibility that this may make it difficult in some cases to ensure the conducting path through the electrode layer, depending on the mixing ratio of this powder to the particles of conductive material, the diffusion of these particles, and the like. In order to solve this problem, in the present invention, another layer of conductive material may be stacked, by sputtering, the AD method or the like, on the layer formed of ceramic particles and particles of conductive material.

In each of the embodiments, the piezoelectric layer 4, 44 is formed directly on the lower electrodes 3, 43. In the present invention, when the particles of conductive material are a metal which tends to diffuse when the piezoelectric layer is annealed, an diffusion-preventive layer may be interposed between the first electrode layer and the piezoelectric layer.

In each of the examples, the material for the lower electrodes was a mixture of alumina powder and Ag powder, a mixture of alumina powder and Au powder, or a mixture of zirconia powder and Ag powder. In the present invention, the material for the lower electrodes may be a mixture of PZT powder and Ag powder or a mixture of PZT powder and Au powder. When the piezoelectric layer is formed on the lower electrodes, the material for it may be only PZT powder.

In each of the embodiments, the production of a piezoelectric actuator is explained as an example. However, the methods according to the present invention may also be used for producing films of various kinds of composite materials, such as for producing battery cell, for producing electrolysis film used in a fuel cell, for performing functional coating (such as high-efficiency catalytic coating, for producing artificial bone used in the medical field), and the like.

What is claimed is:

1. A method of producing a piezoelectric actuator, the method comprising:
   forming a first electrode layer having a plurality of first electrodes on a substrate by jetting an aerosol containing conductive particles and ceramic particles onto the substrate so as to adhere the conductive particles and the ceramic particles to the substrate;

forming a piezoelectric layer on the first electrode layer and the substrate by jetting an aerosol containing piezoelectric particles onto both the first electrode layer, so as to adhere the piezoelectric particles to the first electrode layer, and the substrate;

performing an annealing treatment for the piezoelectric layer to develop piezoelectric characteristics in the piezoelectric layer;

forming, on the piezoelectric layer, a second electrode layer pairing with the first electrode layer; and forming a diffusion-preventive layer, which prevents an element from diffusing into the piezoelectric layer, between the substrate and the piezoelectric layer only at a portion which faces the first electrode layer, wherein the annealing treatment is performed to cause an element contained in the substrate to diffuse into portions of the piezoelectric layer, which are formed directly on the substrate.

2. The method according to claim 1, wherein the ceramic particles are particles of one of alumina and zirconia; and the conductive particles are particles of one of Ag and Au.

3. The method according to claim 1, wherein, before forming the first electrode layer, the diffusion-preventive layer, which prevents the element which is contained in the substrate from diffusing into the piezoelectric layer, is formed by jetting onto the substrate an aerosol containing ceramic particles to adhere the ceramic particles to the substrate.

4. The method according to claim 1, wherein, after forming the first electrode layer, the diffusion preventive layer, which prevents the element which is contained in the first electrode layer from diffusing into the piezoelectric layer, is formed by jetting onto the first electrode layer an aerosol containing ceramic particles to adhere the ceramic particles to the first electrode layer.

5. The method according to claim 1, wherein a mixing ratio of the conductive particles is 4 to 50 weight % in the first electrode layer forming step.

6. A method of producing a piezoelectric actuator, comprising:

forming a multilayer film, which has a first electrode layer having a plurality of first electrodes formed by deposition of conductive particles and ceramic particles and a second layer formed by deposition of ceramic particles, by jetting an aerosol while changing a composition of the conductive particles and the ceramic particles contained in the aerosol;

performing an annealing treatment for the multilayer film; and forming a second electrode, on the multilayer film, which is paired with one of the plurality of first electrodes, such that the second layer is sandwiched between the second electrode and the first electrode, wherein forming the multilayer film comprises forming a first layer by jetting an aerosol containing ceramic particles onto a substrate with an aerosol deposition method so as to adhere the ceramic particles to the substrate, the first layer being formed only at a portion at which the first electrode layer is to be formed;

wherein the ceramic particles for forming the second layer are piezoelectric ceramic particles;

wherein the second layer is formed on the first electrode layer and the substrate; and wherein the annealing treatment is performed to develop piezoelectric characteristics at portions of the second layer, which are formed on the first electrodes respectively and to cause an element contained in the substrate to diffuse into portions of the second layer, which are formed directly on the substrate.

7. The method according to claim 6, wherein the step of forming the multilayer film further comprises:

forming the first electrode layer by jetting an aerosol containing the conductive particles and the ceramic particles by the aerosol deposition method onto a surface of the substance, on which the first layer has been formed; and forming the second layer by jetting an aerosol containing only the ceramic particles by the aerosol deposition method onto a surface of the substance, on which the first electrode layer has been formed.

8. The method according to claim 7, wherein the ceramic particles for forming the first electrode layer are particles of one of alumina and zirconia; and the conductive particles for forming the first electrode layer are particles of one of Ag and Au.

9. A method of producing an ink-jet head constructed by joining a piezoelectric actuator produced by a producing method and an ink-channel forming body provided with ink channels, the method comprising:

providing a metallic substrate as a substrate;

producing a piezoelectric actuator, the producing method comprising:

forming a first electrode layer having a plurality of first electrodes on the substrate by jetting an aerosol containing conductive particles and ceramic particles onto the substrate so as to adhere the conductive particles and the ceramic particles to the substrate;

forming a piezoelectric layer on the first electrode layer and the substrate by jetting an aerosol containing piezoelectric particles onto both of the first electrode layer, so as to adhere the piezoelectric particles to the first electrode layer, and the substrate;

performing an annealing treatment for the piezoelectric layer to develop piezoelectric characteristics in the piezoelectric layer;

forming, on the piezoelectric layer, a second electrode layer pairing with the first electrode layer; and before forming the first electrode layer, forming a diffusion-preventive layer which prevents an element contained in the substrate from diffusing into the piezoelectric layer by jetting onto the substrate an aerosol containing ceramic particles to adhere the ceramic particles to the substrate, the diffusion-preventive layer being formed only at a portion at which the first electrode layer is to be formed;

forming the ink-channel forming body by forming holes which are to be the ink channels in a plurality of metallic plates formed of a same material as that of the metallic substrate, and by stacking and joining the metallic plates together; and joining the metallic substrate to an upper surface of the ink-channel forming body, wherein the annealing treatment is performed to cause an element contained in the substrate to diffuse into portions of the piezoelectric layer, which are formed directly on the substrate.

10. A method of producing an ink jet head constructed by joining a piezoelectric actuator, produced by a producing method, and an ink-channel forming body provided with ink channels, the method comprising:

providing a metallic substrate as a substrate;

producing a piezoelectric actuator, the producing method comprising:

forming a first electrode layer having a plurality of first electrodes on the substrate by jetting an aerosol containing conductive particles and ceramic particles onto the substrate so as to adhere the conductive particles and the ceramic particles to the substrate, wherein a mixing ratio of the conductive particles is 4 to 50 weight % when the first electrode layer is formed;

forming a piezoelectric layer on the first electrode layer and the substrate by jetting an aerosol containing piezoelectric particles onto both of the first electrode layer, so as to adhere the piezoelectric particles to the first electrode layer, and the substrate;

performing an annealing treatment for the piezoelectric layer to develop piezoelectric characteristics in the piezoelectric layer;

forming, on the piezoelectric layer, a second electrode layer pairing with the first electrode layer; and before forming the first electrode layer, forming a diffusion-preventive layer which prevents an element contained in the substrate from diffusing into the piezoelectric layer by jetting onto the substrate an aerosol containing ceramic particles to adhere the ceramic particles to the substrate, the diffusion-preventive layer being formed only at a portion at which the first electrode layer is to be formed;

forming the ink-channel forming body by forming holes which are to be the ink channels in a plurality of metallic plates formed of a same material as that of the metallic substrate and by stacking and joining the metallic plates together; and joining the metallic substrate to an upper surface of the ink-channel forming body, wherein the annealing treatment is performed to cause an element contained in the substrate to diffuse into portions of the piezoelectric layer, which are formed directly on the substrate.

11. The method according to claim 7, wherein the ceramic particles for forming the first layer are particles of alumina.

* * * * *